United States Patent
Murata et al.

(10) Patent No.: US 9,645,000 B2
(45) Date of Patent: May 9, 2017

(54) MEASUREMENT DEVICE AND PURGE GAS FLOW RATE MEASURING METHOD

(71) Applicant: Murata Machinery, Ltd., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 52 days.

(21) Appl. No.: 14/763,546

(22) PCT Filed: Jan. 30, 2014

(86) PCT No.: PCT/JP2014/052066
§ 371 (c)(1),
(2) Date: Jul. 27, 2015

(87) PCT Pub. No.: WO2014/136506
PCT Pub. Date: Sep. 12, 2014

(65) Prior Publication Data
US 2015/0369643 A1 Dec. 24, 2015

(30) Foreign Application Priority Data
Mar. 5, 2013 (JP) .................... 2013-043068

(51) Int. Cl.
*G01F 1/56* (2006.01)
*H01L 21/67* (2006.01)
(Continued)

(52) U.S. Cl.
CPC .............. *G01F 1/56* (2013.01); *G01F 1/28* (2013.01); *H01L 21/67253* (2013.01); *H01L 21/67393* (2013.01); *H01L 21/67769* (2013.01)

(58) Field of Classification Search
CPC ....... G01F 1/56; G01F 1/28; H01L 21/67393; H01L 21/67253; H01L 21/67769
(Continued)

(56) References Cited

U.S. PATENT DOCUMENTS

| 2008/0156069 A1 | 7/2008 | Murata et al. |
| 2015/0000372 A1* | 1/2015 | Otsuka ............... G01N 33/0009 73/23.2 |

(Continued)

OTHER PUBLICATIONS

English translation of Official Communication issued in corresponding International Application PCT/JP2014/052066, mailed on Sep. 17, 2015.

*Primary Examiner* — Walter L Lindsay, Jr.
*Assistant Examiner* — Ruth Labombard
(74) *Attorney, Agent, or Firm* — Keating & Bennett, LLP

(57) ABSTRACT

A purge gas flow rate in a carrier that houses a smaller number of articles than a usual number is measured. The flow rate of the purge gas supplied from a nozzle of a shelf support in a rack is measured by a measurement device. The measurement device includes a substrate, a gas introduction section provided on a bottom surface of the substrate and configured to introduce the purge gas when coming into contact with the nozzle of the shelf support, while maintaining contact with the nozzle airtight with a load from the substrate, a circuit including a flowmeter that measures the purge gas flow rate and a power supply, and a plurality of legs movable in a vertical direction with respect to the substrate and defining a portion of the weight of the measurement device supported on the shelf support.

4 Claims, 4 Drawing Sheets

(51) Int. Cl.
*H01L 21/677* (2006.01)
*G01F 1/28* (2006.01)
*H01L 21/673* (2006.01)

(58) Field of Classification Search
USPC .................................................... 73/861.08
See application file for complete search history.

(56) References Cited

U.S. PATENT DOCUMENTS

2015/0000785 A1\* 1/2015 Shin ................. F17C 5/007
 141/4
2015/0003942 A1\* 1/2015 Takahara ............... A47B 81/00
 414/277

\* cited by examiner

F I G. 1
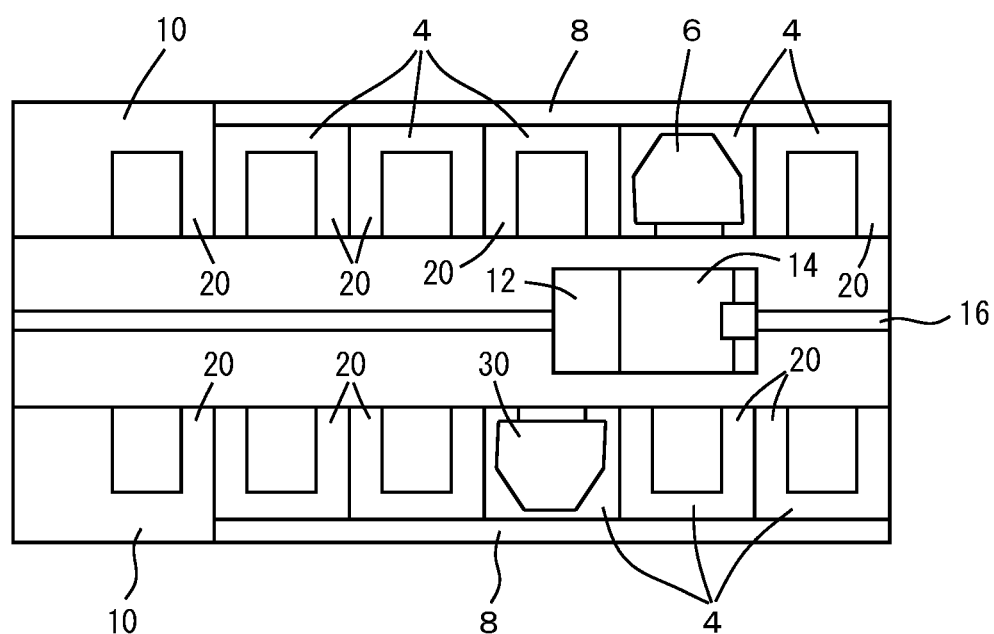

US 9,645,000 B2

MEASUREMENT DEVICE AND PURGE GAS FLOW RATE MEASURING METHOD

BACKGROUND OF THE INVENTION

1. Field of the Invention

The present invention relates to measurement of flow rate of a purge gas flowing into a carrier such as a FOUP in which semiconductor wafers or the like are housed.

2. Description of the Related Art

When articles such as semiconductor wafers or reticles are housed and stored in a carrier such as a FOUP or a reticle pod, a purge gas such as a nitrogen gas or clean dry air is supplied to the carrier in order to prevent contamination, oxidation, and the like of the wafers or the like. Specifically, the purge gas supply line is provided in a stocker, an automated warehouse, and the like in which the carrier is stored, and a nozzle of the supply line and a gas introduction section of the carrier are connected to each other so that the purge gas is introduced into the carrier. A valve of the gas introduction section is configured to open when the gas introduction section is set to the nozzle of the purge gas supply line, and to close when the carrier is removed. In this technique, it is necessary to manage the flow rate of a gas introduced into the carrier. For example, a variation in the state of the supply line, specifically, a variation in blockage of members such as pipes, in-line filters, and the like, a variation in length of the pipes, a variation in operation pressure of the nozzles, a variation in airtightness at connection portions of the carrier and the supply line, or the like cause a problem. The connection portions of the carrier and the gas introduction section are portions constituted by, for example, the nozzle and the gas introduction section, and airtightness therebetween is maintained by the weight of the carrier itself.

The inventors proposed to transport a measurement device including a flowmeter using a transport device provided in a stocker and measure a flow rate of the purge gas at each cell. See, for example, JP4670808B.

When a measurement device is provided with a flowmeter, a power supply, and the like in order to measure the flow rate of the purge gas, the measurement device weighs more than a carrier in which only one wafer is housed. Because the carrier in which only one wafer is housed is light-weight, airtightness between a nozzle and a gas introduction section is insufficient and the purge gas is likely to leak. Accordingly, if a measurement device appropriate for a carrier in which an average number of wafers are housed is used to measure the flow rate, only the flow rate under a favorable condition will be managed. The same problem occurs in the case where another type of articles such as reticles are housed.

SUMMARY OF THE INVENTION

Preferred embodiments of the present invention measure a flow rate of purge gas in a carrier which houses a smaller number of articles than a usual number.

A measurement device according to a preferred embodiment of the present invention measures a flow rate of a purge gas supplied from a nozzle of a shelf support in a rack to a carrier. The measurement device includes a substrate; a gas introduction section provided on a bottom surface of the substrate, and configured to introduce the purge gas when coming into contact with the nozzle of the shelf support, while maintaining contact between the gas introduction section and the nozzle airtight with a load from the substrate; a circuit at least including a flowmeter measuring the flow rate in the gas introduction section and a power supply; and a plurality of legs movable in a vertical direction with respect to the substrate and defining a portion of the weight of the measurement device supported on the shelf support. Preferably, the legs are capable of being moved back and forth as well as right and left in a horizontal plane with respect to the substrate.

In a purge gas flow rate measuring method according to another preferred embodiment of the present invention, a flow rate of a purge gas supplied from a nozzle of a shelf support in a rack to a carrier is measured by a measurement device.

The measurement device includes a substrate; a gas introduction section provided on a bottom surface of the substrate and configured to introduce the purge gas while maintaining contact between the gas introduction section and the nozzle airtight with a load from the substrate; a circuit that at least includes a flowmeter and a power supply; and a plurality of legs movable in a vertical direction with respect to the substrate. In the method according to this preferred embodiment of the present invention, a load of the measurement device is distributed into a portion for the plurality of legs and a portion for the gas introduction section by the plurality of legs supported on the shelf support and the gas introduction section in contact with the nozzle of the shelf support, and the flow rate of the purge gas flowing to the flowmeter via the gas introduction section is measured by the flowmeter.

In various preferred embodiments of the present invention, since the legs support a portion of the weight of the measurement device on the shelf support, the same load is applied to the gas introduction section as in the case of a carrier in which a smaller number of articles are housed. Therefore, the flow rate measurement is performed for a carrier where the purge gas is likely to leak. In other words, measurement of the purge gas flow rate into a carrier is performed in a bad leaky condition. Note that in this specification, descriptions regarding the measurement device are applicable also to the purge gas flow rate measuring method, and descriptions regarding the purge gas flow rate measuring method are also applicable to the measurement device. A load from the measurement device may be distributed into the portion for the legs, the portion for the gas introduction section, and additionally a portion for a guide or the like. Furthermore, for example, a plurality of gas introduction sections may be provided, and a flow rate is measured, for example, for each gas introduction section.

It is preferable that a second substrate supporting at least a portion of the circuit be provided above the substrate defining a first substrate. The legs may be attached to the second substrate and extend onto the shelf support avoiding the first substrate, and are configured to support the weight of the second substrate, that is, a load from the second substrate supported on the shelf support. Note that the load from the first substrate is distributed into, for example, a portion for the gas introduction section and a portion for a guide. Accordingly, by the legs supporting at least a portion of the load from the circuit, the load applied to the gas introduction section is made equal or nearly equal to a load from a light-weight carrier. Furthermore, since a load applied to the gas introduction section varies little, it is not necessary to adjust the load.

Furthermore, it is preferable that the measurement device further includes elastic bodies configured to apply elastic forces downward to the legs; and adjustment members configured to adjust the elastic forces. Also, an adjustment step for the adjustment members adjusting the load applied to the nozzle via the substrate from the gas introduction section is executed. By adjusting the elastic forces to the elastic bodies with the adjustment members in this step, the load applied to the gas introduction section is adjustable in a wide range, and the purge gas flow rate is measured in a carrier in which a small number of articles are housed and in a carrier in which a large number of articles are housed.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a plan view illustrating a stocker in a clean room.

DETAILED DESCRIPTION OF THE PREFERRED EMBODIMENTS

Figure 2:
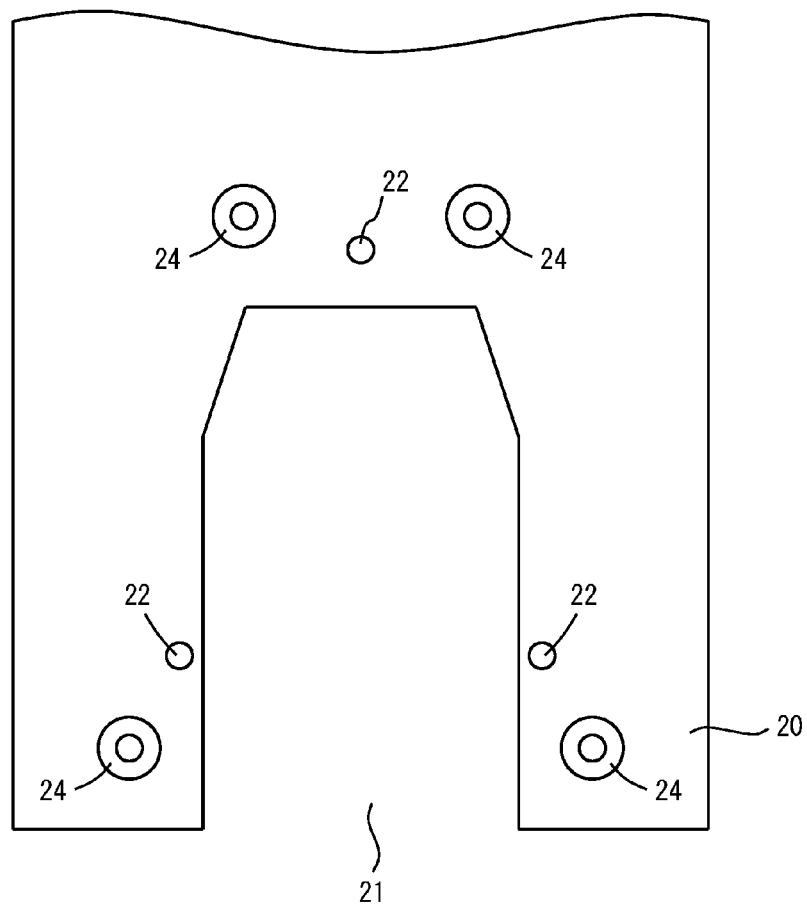
FIG. 2 is a plan view illustrating elements of a shelf board in the stocker.

The following describes preferred embodiments of the present invention. The scope of the present invention is based on the claims, and is intended to be determined in accordance with the understanding of a person skilled in the art with reference to the description of the present invention and related art in the field of the present invention.

FIGS. 1 to 6 show a preferred embodiment and its modifications. FIG. 1 shows a stocker 2 that has an environment in which a measurement device 30 according to a preferred embodiment of the present invention is used. In the stocker 2, a plurality of cells 4 are provided and a carrier such as a FOUP 6 is stored in each cell 4. In the cell 4, a shelf support 20 on which the FOUP 6 is positioned and arranged is provided, and the purge gas such as a nitrogen gas or clean dry air is supplied from a purge gas supplying section 8 to pipes of the shelf support 20, and is supplied from the pipes to the FOUP 6 via nozzles 24 of FIG. 2. In the stocker 2, load ports 10 are provided so as to receive and transfer the FOUPs 6 from and to an overhead transport vehicle, a person, or the like (not shown), and the FOUPs 6 are transported by a transport device 12 between the load ports 10 and the cells 4. The transport device 12 includes an elevation platform 14 on which a transfer device (not shown) is mounted, and is configured to run along a rail 16 and elevate the elevation platform 14 so as to transfer the FOUPs 6 between the cells 4 stacked in multiple stages. Any carrier may be used as long as the purge gas can be introduced into the carrier from the nozzles 24 via gas introduction sections and contact portions between the carrier and the nozzles 24 are kept airtight with the weight of the carrier itself, and any type of articles may be stored in the carrier.

The measurement device 30 is provided in order to measure the flow rate of the purge gas flowing into the FOUP 6 in each cell 4. The measurement device 30 is able to be arranged on the shelf support 20, and the purge gas is introduced from the shelf support 20, similarly to the purge gas introduction to the FOUP 6. The measurement device 30 is provided with flowmeters so as to measure the flow rate of the purge gas introduced into the measurement device 30. Furthermore, the measurement device 30 is transported by the transport device 12 to the cells 4.

FIG. 2 shows the shelf support 20, and the reference numeral 21 denotes an opening, which is an area that an arm of the transfer device enters while supporting the bottoms of the FOUP and the measurement device, and the reference numerals 22 denote coupling pins that position the FOUP 6 and the measurement device 30. The reference numerals 24 denote nozzles that include a valve (not shown). For example, four nozzles 24 are provided, in which three of them are provided to supply the purge gas and the remaining one is provided to exhaust the purge gas, and the number of the nozzles 24 is arbitrary. The valves of the nozzles 24 are always closed by being biased by elastic bodies provided therein, and are opened by a load from the FOUP 6 and the measurement device 30 so that the gas flows. Alternatively, a configuration is also practical in which a sensor (not shown) detects the FOUP 6 and the like, and the upstream valves of the nozzles 24 are opened so that the gas flows. Note that various types of structure of the nozzles 24 are known, and any type of structure may be used.

Figure 3:
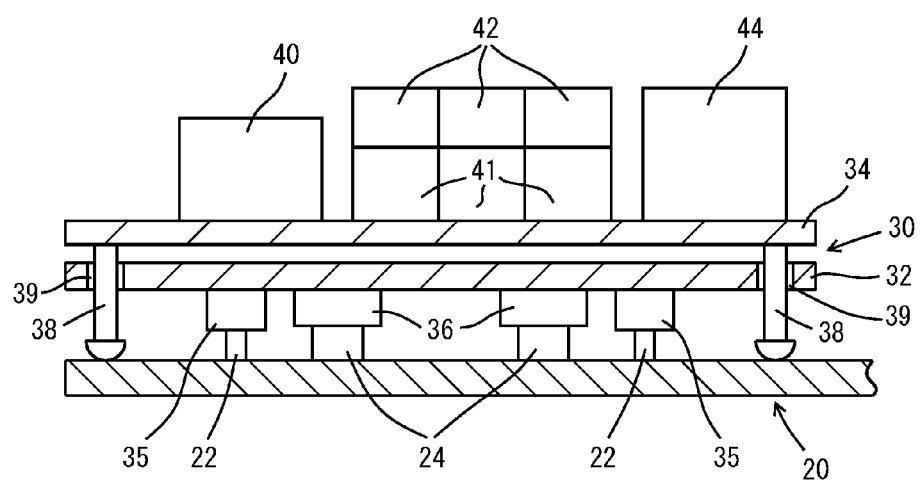
FIG. 3 is a cross-sectional view, seen in the horizontal direction, illustrating a measurement device of a preferred embodiment of the present invention.
Figure 4:
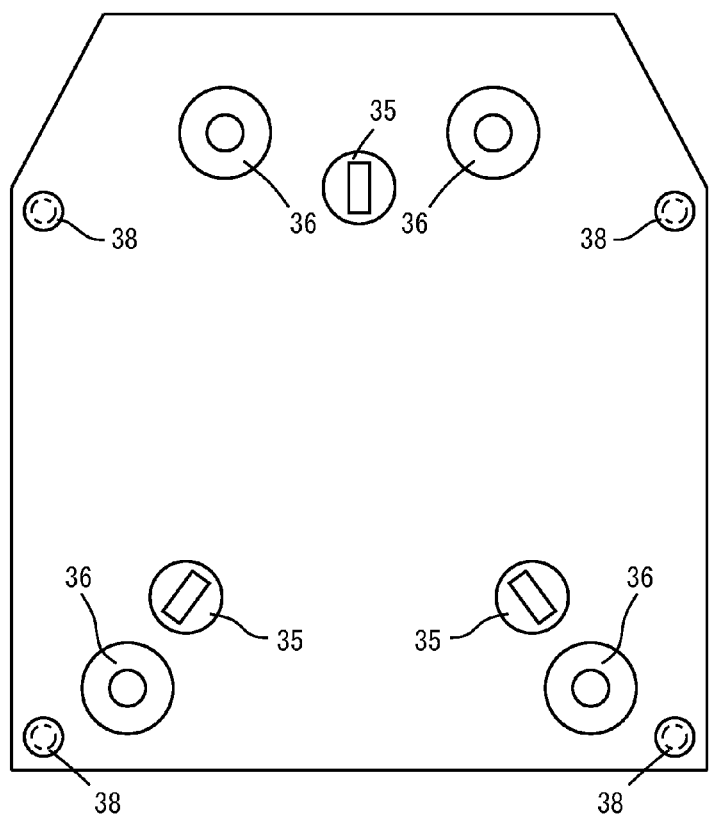
FIG. 4 is a bottom view illustrating the measurement device of a preferred embodiment of the present invention.

FIGS. 3 and 4 show the measurement device 30 of the present preferred embodiment. The measurement device 30 includes, for example, a pair of lower and upper substrates 32 and 34 that are made from metal or the like, and the lower substrate 32 preferably includes three guides 35 and three or four gas introduction sections 36, for example. They are equivalents of components provided on the bottom of the FOUP 6. The guides 35 guide the coupling pins 22. The gas introduction sections 36 cover the nozzles 24 in an airtight manner using elastic grommets (not shown), with the weight of the substrate 32 itself. The valves built in the nozzles 24 are opened by a load from the substrate 32, and the purge gas is introduced into flowmeters 41. Alternatively, a presence detection sensor (not shown) provided on the shelf support 20 side may detect the measurement device 30, and a controller of the stocker 2 or a controller provided on the shelf support 20 may open valves of a gas flow path that are connected to the nozzles 24 so that the purge gas is introduced into the flowmeters 41. Note that the built-in valves are not essential, and the grommet is a gastight seal made from a fluororesin, a fluororubber, a fluororubber sponge, a urethane resin, a urethane rubber, a urethane rubber sponge, a silicone resin, a silicone rubber, a silicone rubber sponge, or the like. Most of the load from the substrate 32 is supported by the nozzles 24, and a relatively small proportion of the load is supported by the pins 22. Furthermore, the weight of the substrate 32 is the same as that of a lightweight FOUP, for example, housing only one wafer, and the same amount of the purge gas passes through the valves of the gas introduction sections 36 as that passing the FOUP housing only one wafer. Note that by disposing an additional weight on the substrate 32, the purge gas flow rate is measured if a large number of wafers are housed. Furthermore, the flow rate of the purge gas that flows into the measurement device 30 from the gas introduction sections 36 is important and the flow rate of the purge gas that flows out of the measurement device 30 does not need to be measured.

For example, three or four pins 38 project downward from the substrate 34 while passing through through-holes 39 of the substrate 32, and are supported on the shelf support 20. Therefore, the weight of the substrate 34 is supported by the pins 38 and the shelf support 20. A power supply 40 such as a battery or a DC/DC converter, the flowmeters 41 provided for the respective gas introduction sections 36, for example, displays 42 that display a flow rate, a data logger 44, and the like are mounted on the substrate 34. Instead of the data logger, a communication device may be mounted. The total weight of the components from the power supply 40 to the data logger 44 is large, and is larger than the total weight of a cover and a flap of the FOUP 6. Furthermore, the gas introduction sections 36 and the flowmeters 41 are connected to each other by pipes (not shown). Note that if no shelf support 20 is provided, the substrate 34 will be lowered from its position in FIG. 3 and supported by the substrate 32, in which at that time, the pins 38 are subjected to centering in the holes 39 by a centering mechanism (not shown). Furthermore, the pins 38 are examples of legs, and the legs are not limited to the pins. The pins 38 are movable in the through-holes 39 up and down, and back and forth as well as right and left. When the measurement device 30 is set on the shelf support 20, the pins 38 are first brought into contact with the shelf support 20, and thus it is necessary to move the substrate 32 with respect to the pins 38 back and forth as well as right and left in a horizontal plane when the guides 35 guide the coupling pins 22.

The following will describe how to use the measurement device 30. The measurement device 30 is transferred to a cell 4 by the transport device 12 of FIG. 1, and the gas introduction sections 36 are positioned at the nozzles 24 using the coupling pins 22 and the guides 35. By setting the total weight of the substrate 32 equal or substantially equal to that of the FOUP 6 in which one wafer is housed, the flow rate of the purge gas is measured when one wafer is housed. Then, measurement data is collected in the data logger 44, the measurement device 30 is taken out from the load port 10, and analysis is conducted. If the measurement device 30 is transported by a person, he or she visually recognizes the flow rates displayed on the displays 42. Furthermore, in order to exactly recognize the flow rate when more than one wafers are housed, a weight that corresponds to the number of the wafers only need to be disposed on the substrate 32, but it is not necessary to measure the flow rate when more than one wafers are housed since a case where one wafer is housed is the worst case condition.

Figure 5:
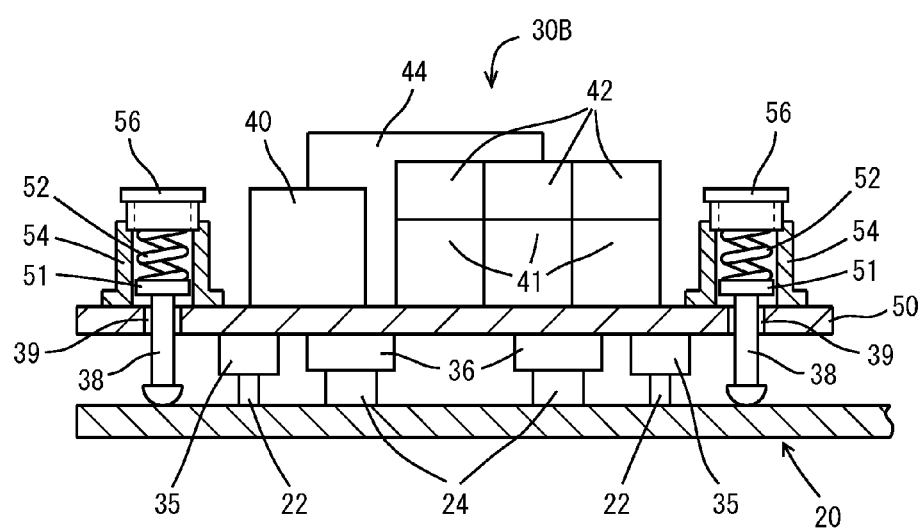
FIG. 5 is a cross-sectional view, seen in the horizontal direction, illustrating a measurement device according to a modification of a preferred embodiment of the present invention.

FIG. 5 shows a measurement device 30B according to a modification of a preferred embodiment of the present invention, and the measurement device 30B is the same as the measurement device 30 shown in FIGS. 3 and 4 except for the features specifically noted. The guides 35, the gas introduction sections 36, the power supply 40, the flowmeters 41, the displays 42, and the data logger 44 are mounted on a substrate 50. Flanges 51 are respectively provided on the upper sections of three to four pins 38, and elastic bodies 52 respectively abut against and bias the flanges 51 downward. Each pin 38 and the corresponding elastic body 52 are housed in a case 54. The case 54 is threaded on its inner circumference and is engaged with the thread of a screw member 56, and the screw member 56 regulates the upper position of the elastic body 52 to adjust an elastic force to be applied to the pin 38. Accordingly, the load applied to the gas introduction sections 36 is adjusted and made nearly constant, if only one wafer is housed, and if a plurality of wafers are housed. Other features are the same as those of the measurement device 30 shown in FIGS. 3 and 4. Although the pins 38 pass through the substrate 50 in FIG. 5, the pins 38 only need to be held so as not to fall down from the substrate 50 and be pressed downward, and do not necessarily pass through the substrate 50.

A cover may be attached to the measurement device 30 so that the measurement device 30 has the same shape as that of the FOUP 6, for example. Furthermore, when a flap that opens and closes and a seal provided at the periphery of the flap are attached to the cover as with the FOUP 6, and the flow rates of the purge gas flowing into the measurement device and the purge gas flowing out from the measurement device are measured, it will be possible to estimate the degree of leak of the purge gas from the FOUP 6.

Figure 6:
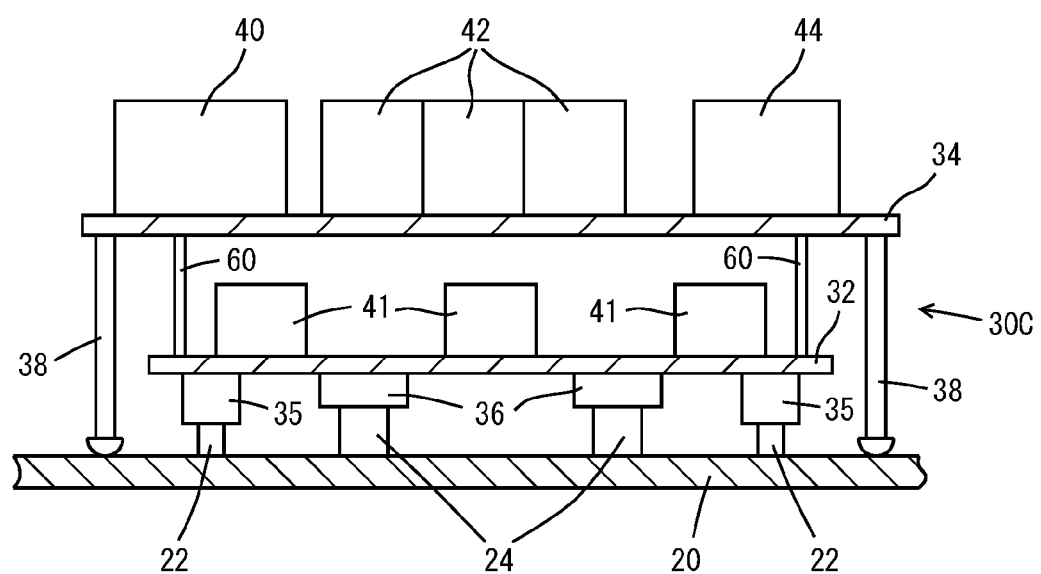
FIG. 6 is a cross-sectional view, seen in the horizontal direction, illustrating a measurement device according to a second modification of a preferred embodiment of the present invention.

FIG. 6 shows a second modification of a preferred embodiment of the present invention, and the second modification is preferably the same as the preferred embodiment shown in FIGS. 3 and 4, except for the features specifically noted. In a measurement device 30C of the modification of FIG. 6, the flowmeters 41 are mounted on the substrate 32, and the pins 38 are arranged outside the substrate 32. The substrates 32 and 34 are coupled to each other by deformable connecting members 60 such as wires, for example. In the above-described manner, some of the circuit elements such as the power supply 40, the flowmeters 41, the displays 42, and the data logger 44 may be mounted on the substrate 32, and the pins 38 may not pass through the substrate 32. Note that in this case, it is premised that the substrate 32 has the same weight or substantially the same weight as that of the carrier in which, for example, one wafer is housed.

According to the preferred embodiments of the present invention, the low flow rate of the purge gas in the lightweight FOUP 6 housing only one wafer is measured accurately. While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A measurement device that measures a flow rate of a purge gas supplied from a nozzle of a shelf support in a rack to a carrier, the measurement device comprising:
   a substrate;
   a gas introduction section provided on a bottom surface of the substrate and configured to introduce the purge gas when coming into contact with the nozzle of the shelf support, while maintaining airtight contact between the gas introduction section and the nozzle with a load from the substrate;
   a circuit at least including a flowmeter that measures the flow rate in the gas introduction section and a power supply; and
   a plurality of legs movable in a vertical direction with respect to the substrate and defining a portion of a weight of the measurement device supported on the shelf support.

2. The measurement device according to claim 1, wherein the substrate is a first substrate;
   a second substrate is provided above the first substrate and supports at least a portion of the circuit; and
   the legs are attached to the second substrate and extend onto the shelf support avoiding the first substrate, and are configured to support a weight of the second substrate on the shelf support.

3. The measurement device according to claim 1, further comprising:
   elastic bodies applying elastic forces downward to the legs; and
   adjustment members adjusting the elastic forces applied by the elastic bodies.

4. A purge gas flow rate measuring method in which a measurement device measures a flow rate of a purge gas supplied from a nozzle of a shelf support in a rack to a carrier, the measurement device including a substrate, a gas introduction section provided on a bottom surface of the substrate and configured to introduce the purge gas while maintaining airtight contact between the gas introduction section and the nozzle with a load from the substrate, a circuit at least including a flowmeter and a power supply, and a plurality of legs movable in the vertical direction with respect to the substrate, the method comprising:
   distributing a load of the measurement device into a portion for the plurality of legs and a portion for the gas introduction section by the plurality of legs supported on the shelf support and the gas introduction section in contact with the nozzle of the shelf support; and
   measuring by the flowmeter the flow rate of the purge gas flowing to the flowmeter via the gas introduction section.

* * * * *